(12) United States Patent
Zhang et al.

(10) Patent No.: US 8,125,271 B2
(45) Date of Patent: Feb. 28, 2012

(54) POWER AMPLIFIER AND BRIDGE CIRCUIT IN POWER AMPLIFIER

(75) Inventors: Lei Zhang, Jiangsu (CN); Herb He Huang, Jiangsu (CN)

(73) Assignee: Shanghai Lexvu Opto Microelectronics Technology Co., Ltd., Shanghai (CN)

( * ) Notice: Subject to any disclaimer, the term of this patent is extended or adjusted under 35 U.S.C. 154(b) by 0 days.

(21) Appl. No.: 12/821,968

(22) Filed: Jun. 23, 2010

(65) Prior Publication Data

US 2011/0204982 A1    Aug. 25, 2011

(30) Foreign Application Priority Data

Feb. 25, 2010   (CN) .......................... 2010 1 0114944

(51) Int. Cl.
*H03F 3/217*   (2006.01)
(52) U.S. Cl. ....................................... 330/251; 330/295
(58) Field of Classification Search .................... 330/10, 330/207 A, 251, 124 R, 295
See application file for complete search history.

(56) References Cited

U.S. PATENT DOCUMENTS

| | | | |
|---|---|---|---|
| 7,332,962 B2 * | 2/2008 | Wu et al. ...................... | 330/251 |
| 2010/0090764 A1 * | 4/2010 | Buter et al. ................... | 330/251 |

FOREIGN PATENT DOCUMENTS

| | | |
|---|---|---|
| CN | 201226017 Y | 4/2009 |
| CN | 101425784 A | 5/2009 |
| CN | 101540587 A | 9/2009 |
| EP | 1014566 A2 | 6/2000 |
| WO | WO 2009/005345 A1 | 1/2009 |

OTHER PUBLICATIONS

PCT/CN2011/070642, International Search Report dated Apr. 28, 2011, 10 pages.
PCT/CN2011/070642, filed Jan. 26, 2011, International Search Report, 4 pages.

* cited by examiner

*Primary Examiner* — Khanh Nguyen
(74) *Attorney, Agent, or Firm* — Kilpatrick Townsend & Stockton LLP

(57) ABSTRACT

A power amplifier and a bridge circuit in a power amplifier, thereinto, the power amplifier includes a comparator, a bridge circuit and a low-pass filter. The comparator is adapted to receive a first analog signal, compare the first analog signal with a reference signal and output a square wave signal. The bridge circuit is adapted to amplify the square wave signal and output the amplified square wave signal. The low-pass filter is adapted to convert the amplified square wave signal into a second analog signal. The bridge circuit includes a first MEMS switch and a second MEMS switch. The first MEMS switch and the second MEMS switch turn on alternately when the polarity of the square wave changes, and output a first voltage signal or a second voltage signal respectively. The amplified square wave signal includes the first voltage signal and the second voltage signal output alternately. The present disclosure substitutes the MOS transistors in prior art with surface MEMS switches, so the power consumption, the size of devices and the manufacture costs all can be reduced.

14 Claims, 4 Drawing Sheets

-- Prior Art--

POWER AMPLIFIER AND BRIDGE CIRCUIT IN POWER AMPLIFIER

CROSS REFERENCE TO RELATED APPLICATIONS

The present application claims the priority of Chinese Patent Application No. 201010114944.3, entitled "Power amplifier and bridge circuit in power amplifier", and filed Feb. 25, 2010, the entire disclosure of which is incorporated herein by reference.

BACKGROUND OF THE INVENTION

1. Field of the Invention

The present invention relates to a power amplifier, and particularly relates to a power amplifier for amplifying audio frequency signal or other analog signals, and a bridge circuit in a power amplifier.

2. Description of Prior Art

As shown in FIG. 1, a conventional power amplifier includes a comparator 1, a bridge circuit 2, and a low-pass filter 3. The bridge circuit 2 includes NMOS transistor 21 and PMOS transistor 22. The gates of NMOS transistor 21 and PMOS transistor 22 are both connected to the output end of the comparator 1. The source electrode of PMOS transistor 22 is connected to a high voltage signal HV, while the source electrode of NMOS transistor 21 is connected to ground. The bridge circuit 2 includes NMOS transistor 21 and PMOS transistor 22. The drains of NMOS transistor 21 and PMOS transistor 22 are both connected to the input end of the low-pass filter 3. During working, the comparator 1 compares a first analog signal (for example, a audio frequency signal) with a reference signal 5, and exports a square wave signal. The bridge circuit 2 realizes amplifying the audio frequency signal by activating the NMOS transistor 21 or the PMOS transistor 22, according to the square wave signal. The output signal of the bridge circuit 2 is changed to an audio frequency signal (a second analog signal) by the low-pass filter 3, and then exported to loudhailer 4.

Detailed descriptions regarding an audio power amplifier are disclosed in other documents such as Chinese patent application No. 200810166133.0 and No. 200810239524.0. The audio power amplifier disclosed in patent application No. 200810166133.0 includes a comparator and a full bridge output circuit, and the comparator exports a pulse width modulated square wave signal. The full bridge output circuit includes an inverter and four MOS transistors M1, M2, M3 and M4, which amplifies the pulse width modulated square wave signal exported by the comparator. The audio power amplifier disclosed in patent application No. 200810239524.0 includes a pre-amplifier, an error amplifier, a comparator, a bridge circuit and a feedback circuit, wherein the bridge circuit and the pre-amplifier are composed of transistors.

The circuits described above are all started by pulse signals activating the corresponding transistors. As we all know, transistors cost much power during working. What's more, manufacturing comparators and triangle wave generators which generate the reference signal 5 adopts standard CMOS technology, while manufacturing PMOS and NMOS transistors adopts high voltage CMOS technology which is different from the standard CMOS technology. Therefore the comparators, triangle wave generators, PMOS and NMOS transistors mentioned above all have to adopt high voltage CMOS technology, which is complex, enlarges the area of all devices and increases the cost.

SUMMARY OF THE INVENTION

An object of the present invention is to provide a power amplifier whose manufacturing cost is reduced, manufacturing process is simplified and power consumption is reduced.

To achieve the project, the present invention provides a power amplifier which comprises a comparator, a bridge circuit and a low-pass filter. The comparator receives a first analog signal, compares the first analog signal with a reference signal, and then exports a square wave signal. The bridge amplifies the square wave signal and exports the amplified square wave signal. The low-pass filter converts the amplified square wave signal into a second analog signal. The mentioned bridge circuit comprises a first MEMS switch and a second MEMS switch. The first MEMS switch and the second MEMS switch turn on alternately when the polarity of the square wave signal changes, and export a first voltage signal or a second voltage signal accordingly. The amplified square wave signal includes the first voltage signal and the second voltage signal which are exported in turns.

Optionally, the first MEMS switch comprises a first electrode and a second electrode. The first electrode comprises a first conductor and a second conductor connected to the input end of the low-pass filter, and the second electrode comprises a first connecting conductor. The first electrode and the second electrode are configured to shift away from or close to each other according to the square wave signal, in order to connect the first conductor and the second conductor through the first connecting conductor. The second MEMS switch comprises a third electrode and a fourth electrode. The third electrode comprises a third conductor and a fourth conductor connected to the input end of the low-pass filter, and the fourth electrode comprises a second connecting conductor. The third electrode and the fourth electrode are configured to shift away from or close to each other according to the square wave signal, in order to connect the third conductor and the fourth conductor through the second connecting conductor, thereby outputting the second voltage signal which is put on the third conductor from the fourth conductor.

Optionally, the first electrode further comprises a first basal plate and a first insulating layer set on the first basal plate, while the first conductor and the second conductor are on the surface of the first insulating layer. The second electrode further comprises a second polar plate and a second insulating layer, while the first connecting conductor and the second polar plate are arranged on the opposite surface of the second insulating layer. The first basal plate and the second polar plate are configured to shift away from or close to each other according to the square wave signal. The third electrode further comprises a second basal plate and a third insulating layer set on the second basal plate, while the third conductor and the fourth conductor are arranged on the surface of the third insulating layer. The fourth electrode further comprises a third polar plate and a fourth insulating layer, while the second connecting conductor and the third polar plate are arranged on the opposite surface of the fourth insulating layer. The second basal plate and the third polar plate are configured to shift away from or close to each other according to the square wave signal.

Optionally, the output end of the comparator is connected to the second polar plate of the first MEMS switch and the third polar plate of the second MEMS switch, while the first basal plate and the second basal plate are of opposite polarity.

Or the output end of the comparator is connected to the second polar plate of the first MEMS switch and the second basal plate of the second MEMS switch, while the first basal plate and the third polar plate are of opposite polarity. Or the output end of the comparator is connected to the first basal plate of the first MEMS switch and the third polar plate of the second MEMS switch, while the second polar plate and the second basal plate are of opposite polarity. Or the output end of the comparator is connected to the first basal plate of the first MEMS switch and the second basal plate of the second MEMS switch, while the second polar plate and the third polar plate are of opposite polarity.

Optionally, the output end of the comparator is connected to the second polar plate of the first MEMS switch, and to the third polar plate of the second MEMS switch through an inverter, while the first basal plate and the second basal plate are of the same polarity. Or the output end of the comparator is connected to the second polar plate of the first MEMS switch, and to the second basal plate of the second MEMS switch through an inverter, while the first basal plate and the third polar plate are of the same polarity. Or the output end of the comparator is connected to the first basal plate of the first MEMS switch, and to the third polar plate of the second MEMS switch through an inverter, while the second polar plate and the second basal plate are of the same polarity. Or the output end of the comparator is connected to the first basal plate of the first MEMS switch, and to the second basal plate of the second MEMS switch through an inverter, while the second polar plate and the third polar plate are of the same polarity.

Optionally, the first electrode further comprises a first basal plate and a first insulating layer set on the first basal plate. A first polar plate, the first conductor and the second conductor are on the surface of the first insulating layer. The second electrode further comprises a second polar plate and a second insulating layer. The first connecting conductor and the second polar plate are arranged on the opposite surface of the second insulating layer. The first polar plate and the second polar plate are configured to shift away from or close to each other according to the square wave signal. The third electrode further comprises a second basal plate and a third insulating layer set on the second basal plate. A fourth polar plate, the third conductor and the fourth conductor are on the surface of the third insulating layer. The fourth electrode further comprises a third polar plate and a fourth insulating layer. The second connecting conductor and the third polar plate are arranged on the opposite surface of the fourth insulating layer. The fourth polar plate and the third polar plate are configured to shift away from or close to each other according to the square wave signal.

Optionally, the output end of the comparator is connected to the second polar plate of the first MEMS switch and the third polar plate of the second MEMS switch, while the first polar plate and the fourth polar plate are of opposite polarity. Or the output end of the comparator is connected to the first polar plate of the first MEMS switch and the fourth polar plate of the second MEMS switch, while the second polar plate and the third polar plate are of opposite polarity. Or the output end of the comparator is connected to the second polar plate of the first MEMS switch and the fourth polar plate of the second MEMS switch, while the first polar plate and the third polar plate are of opposite polarity. Or the output end of the comparator is connected to the first polar plate of the first MEMS switch and the third polar plate of the second MEMS switch, while the second polar plate and the fourth polar plate are of opposite polarity.

Optionally, the output end of the comparator is connected to the first polar plate of the first MEMS switch, and to the fourth polar plate of the second MEMS switch through an inverter, while the second polar plate and the third polar plate are of the same polarity. Or the output end of the comparator is connected to the first polar plate of the first MEMS switch, and to the third polar plate of the second MEMS switch through an inverter, while the second polar plate and the fourth polar plate are of the same polarity. Or the output end of the comparator is connected to the second polar plate of the first MEMS switch, and to the fourth polar plate of the second MEMS switch through an inverter, while the first polar plate and the third polar plate are of the same polarity. Or the output end of the comparator is connected to the second polar plate of the first MEMS switch, and to the third polar plate of the second MEMS switch through an inverter, while the first polar plate and the fourth polar plate are of the same polarity.

To the accomplishment of the foregoing, the present invention further provides a bridge circuit in a power amplifier, and the bridge circuit comprises a first MEMS switch and a second MEMS switch. The first MEMS switch receives a square wave signal and a first voltage signal, and the second MEMS switch receives a square wave signal and a second voltage signal. The first MEMS switch and the second MEMS switch turn on alternately according to the polarity of the square wave signal, and then output a first voltage signal and a second voltage signal. The amplified square wave signal is composed of the first voltage signal and the second voltage signal which are output alternately.

Optionally, the output end of the comparator is connected to the second polar plate of the first MEMS switch, and to the third polar plate of the second MEMS switch, while the first basal plate and the second basal plate are of opposite polarity. Or the output end of the comparator is connected to the second polar plate of the first MEMS switch and the second basal plate of the second MEMS switch, while the first basal plate and the third polar plate are of opposite polarity. Or the output end of the comparator is connected to the first basal plate of the first MEMS switch and the third polar plate of the second MEMS switch, while the second polar plate and the second basal plate are of opposite polarity. Or the output end of the comparator is connected to the first basal plate of the first MEMS switch and the second basal plate of the second MEMS switch, while the second polar plate and the third polar plate are of opposite polarity.

Compared with the prior art, the present invention substitutes the transistors with MEMS switches whose on-off are under the control of a comparator, and the invention uses surface MEMS technology, thereby the power consumption is reduced. What is more, MEMS switches, comparators and low-pass filters all can adopt CMOS technology, that is to say, they can be overlapped, which can reduce the size of all components and the manufacture costs.

DETAILED DESCRIPTION OF THE EMBODIMENTS

Figure 1:
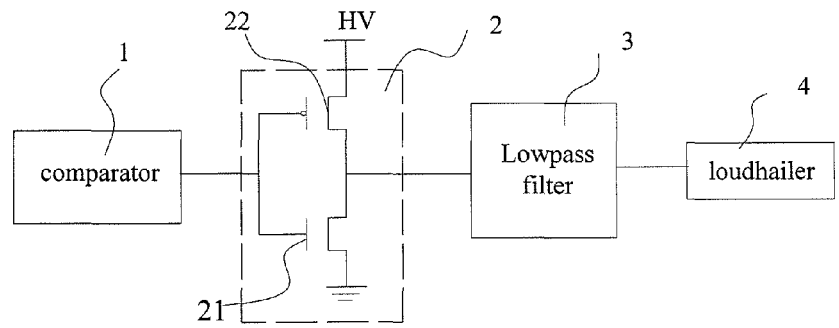
FIG. 1 shows the structure of the prior power amplifier.
Figure 2:
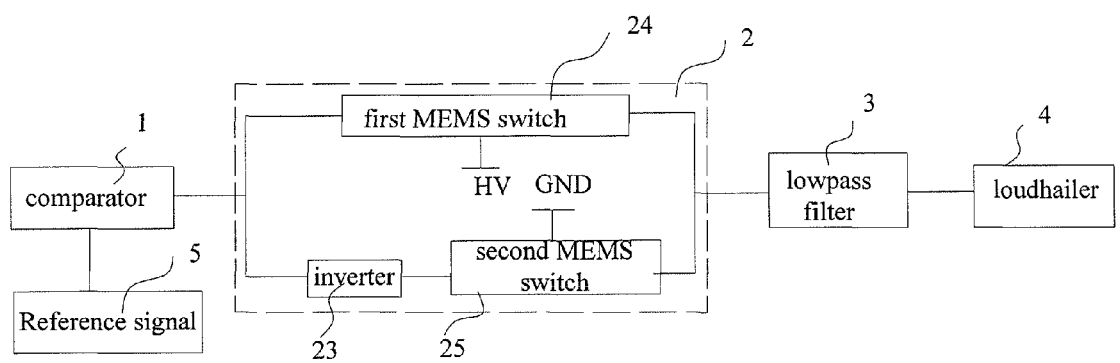
FIG. 2 shows one functional block diagram of the power amplifier of the present invention.

Referring to FIG. 2, a power amplifier of the present invention includes: a comparator 1, a bridge circuit 2, and a low-pass filter 3.

Referring to FIG. 2, the comparator 1 receives a first analog signal, compares the first analog signal with a reference signal, and then exports a square wave signal. The first analog signal refers in particular to an audio signal in all the embodiments hereinafter.

Figure 3:
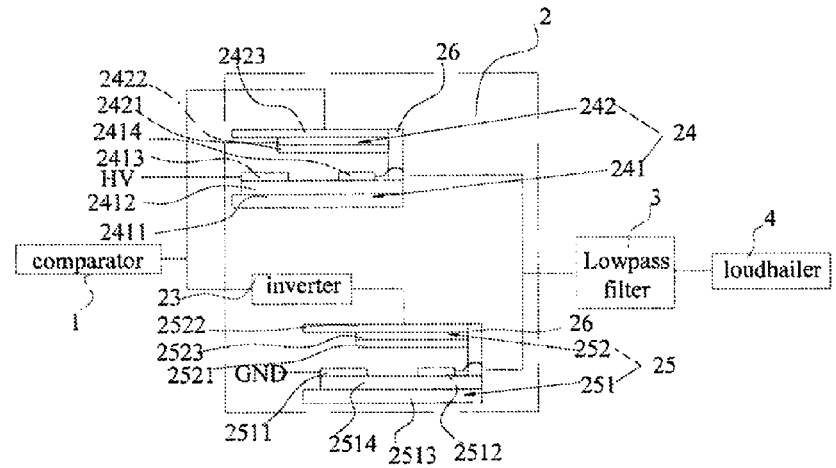
FIG. 3 shows the structure of the power amplifier according to the first embodiment of the present invention.

Referring to FIG. 2 and FIG. 3, the bridge circuit includes: an inverter 23, a first MEMS switch 24 and a second MEMS switch 25.

The inverter 23 is connected to the output end of the comparator 1.

Referring to FIG. 2 and FIG. 3, the first MEMS switch 24 connected to the output end of the comparator 1 receives a first voltage signal, which is a high voltage HV in this embodiment. The first MEMS switch 24 is also connected to the input end of the low-pass filter 3.

Specifically, the first MEMS switch 24 comprises a first electrode 241 and a second electrode 242. The first electrode 241 comprises a first basal plate 2411, a first insulating layer 2412, a first conductor 2413 and a second conductor 2414. The first basal plate 2411 receives a first control signal (not shown in the figures), which controls the polarity of the first basal plate 2411. The first insulating layer 2412 is upon the first basal plate 2411, and the first conductor 2413 and the second conductor 2414 are arranged upon the first insulating layer 2412 with some interval. The first conductor 2413 is connected to the high voltage HV, and the second conductor 2414 is connected to the input end of the low-pass filter 3. The second electrode 242 is connected to the input end of the comparator 1. To be specific, the second electrode 242 comprises a first connecting conductor 2421, a second insulating layer 2422, a second polar plate 2423, the second polar plate 2423 is connected to the input end of the comparator 1, and the first connecting conductor 2421 and the second polar plate 2423 are arranged upon the opposite surface of the second insulating layer 2422.

Referring to FIG. 3, the input end of the inverter 23 is connected to the output end of the comparator 1. The second MEMS switch 25 connected to the output end of the inverter 23 receives a second voltage signal, which is a ground signal, in this embodiment. The second MEMS switch 25 is also connected to the input end of the low-pass filter 3.

Specifically, the second MEMS switch 25 comprises a third electrode 251 and a fourth electrode 252. The third electrode 251 comprises a third conductor 2511 and a fourth conductor 2512. The third conductor 2511 is connected to the second voltage signal, and the fourth conductor 2512 is connected to the input end of the low-pass filter 3. The third electrode 251 further comprises a second basal plate 2513 and a third insulating layer 2514. The third insulating layer 2514 is upon the second basal plate 2513, and the third conductor 2511 and the fourth conductor 2512 are arranged upon the third insulating layer 2514 with some interval. The second basal plate 2513 receives a second control signal (not shown in the figures), which controls the polarity of the second basal plate 2513. The fourth electrode 252 is connected to the output end of the inverter 23. To be specific, the fourth electrode 252 comprises a second connecting conductor 2521, a third polar plate 2322 and a fourth insulating layer 2523. The third polar plate 2522 is connected to the output end of the inverter 23. The second connecting conductor 2521 and the third polar plate 2522 are arranged upon the opposite surface of the fourth insulating layer 2523.

What is more, the first MEMS switch 24 and the second MEMS switch 25 both comprise a spring arm 26. The spring arm 26 of the first MEMS switch 24 is set on the first electrode 241 and connected to the second electrode 242, so the first electrode 241 and the second electrode 242 can shift away from or close to each other. The spring arm 26 of the second MEMS switch 25 is set on the third electrode 251 and connected to the fourth electrode 252, so the third electrode 251 and the fourth electrode 252 can shift away from or close to each other.

Referring to FIG. 3, the working process of the power amplifier in this embodiment is as follows.

Ordinarily, the first analog signal (an audio signal) is a sine wave, and the reference signal 5 is a triangular wave, which is generated by a triangular wave generator. The comparator 1 compares the audio signal with the reference signal 5, and then outputs a square wave signal. The square wave signal is composed of alternate a third voltage and a fourth voltage, and the third voltage is higher than the fourth voltage. That the polarity of the square wave signal is positive means the square wave signal is the third voltage, and that the polarity of the square wave signal is negative means the square wave signal is the fourth voltage. In this embodiment, the polarity of the first control signal put on the first basal plate 2411 of the first MEMS switch 24 and the polarity of the second control signal put on the second basal plate 2513 of the second MEMS switch 25 are the same, for example, the polarity is negative (the first control signal and the second control signal both are the fourth voltage).

The comparator 1 compares the audio signal with the reference signal 5, and then outputs a square wave signal. When the polarity of the square wave signal is positive, the polarity of the second polar plate 2423 is positive too. Because the polarity of the second polar plate 2423 and the first basal plate 2411 are opposite to each other, static pull-in working on the second polar plate 2423 draws it near to the first conductor 2413 and the second conductor 2414 of the first electrode 241, in this way, the first conductor 2413, the second conductor 2414, and the first connecting conductor 2421 will bring into contact with each other and be activated, whereby the high voltage HV can be transmitted into the low-pass filter 3. Moreover, the polarity of the square wave signal is changed to negative after running through the inverter 23, as well as the polarity of the third polar plate 2522. Because the polarity of the third polar plate 2522 and the second basal plate 2513 are the same, the third polar plate 2522 will not move to the second basal plate 2513, so the second connecting conductor 2521, the third conductor 2511 and the fourth conductor 2512 will not be activated. When the polarity of the square wave signal is negative, the polarity of the second polar plate 2423 is negative too, that is to say, the polarity of the second polar plate 2423 and the first basal plate 2411 are the same, thereby they will repel each other, and the second basal plate 2513 will depart from the second polar plate 2423. Moreover, the polarity of the square wave signal is changed to positive after running through the inverter 23, as well as the polarity of the third polar plate 2522. Because the polarity of the third polar plate 2522 and the second basal plate 2513 are opposite to each other, the third polar plate 2522 will move to the third conductor 2511 and the fourth conductor 2512, in this way, the third conductor 2511 and the fourth conductor 2512 will be connected through the second connecting conductor 2521, and the ground signal will be transmitted to the input end of the low-pass filter 3. Thereby, the input end of the low-pass filter 3 will receive alternate HV and ground signal because of the output of the comparator 1. That is to say, the amplitude value of the square wave signal which is output by the comparator 1 is amplified to HV after running through the first MEMS switch 24 and the second MEMS switch 25. The square wave signal will be changed to an amplified audio signal (the second analog signal), and then transmitted to the input end of the loudhailer 4.

In addition, when the first control signal put on the first basal plate 2411 of the first MEMS switch 24 and the second control signal put on the second basal plate 2513 of the second MEMS switch 25 is positive (for example, they are the third voltage), the system can get the same effect. Simply the difference is as follows. When the square wave signal output by the comparator 1 is positive, the second MEMS switch 25 turns on, while the first MEMS switch 24 turns off. When the square wave signal output by the comparator 1 is negative, the first MEMS switch 24 turns on, while the second MEMS switch 25 turns off.

Some variations to this embodiment of the present invention are as follows. The first control signal is put on the first basal plate 2411, the output end of the comparator 1 is connected to the second polar plate 2423, the second control signal is put on the third polar plate 2522, and the output end of the inverter 23 is connected to the second basal plate 2513. Or, the first control signal is put on the second polar plate 2423, the output end of the comparator 1 is connected to the first basal plate 2411, the second control signal is put on the second basal plate 2513, and the output end of the inverter, 23 is connected to the third polar plate 2522. Or, the first control signal is put on the second polar plate 2423, the output end of the comparator 1 is connected to the first basal plate 2411, the second control signal is put on the third polar plate 2522, and the output end of the inverter 23 is connected to the second basal plate 2513.

In this embodiment, when the polarity of the first control signal and the second control signal both are negative, while the output signal of the comparator is positive, the first MEMS switch 24 will be switched on and the second MEMS switch 25 will be switched off. However, if the output signal of the comparator is negative, the first MEMS switch 24 will be switched off and the second MEMS switch 25 will be switched on. Therefore, the first MEMS switch 24 and the second MEMS switch 25 will just be switched on when the polarity of the square wave signal is opposite.

In conclusion, the present invention substitutes the transistors with surface MEMS switches whose on-off are under the control of a comparator, the power consumption is reduced. What is more, MEMS switches, comparators and low-pass filters all can adopt CMOS technology, that is to say, MEMS switches, comparators and low-pass filters can be overlapped, which can reduce the size of all components and the manufacture costs.

Figure 4:
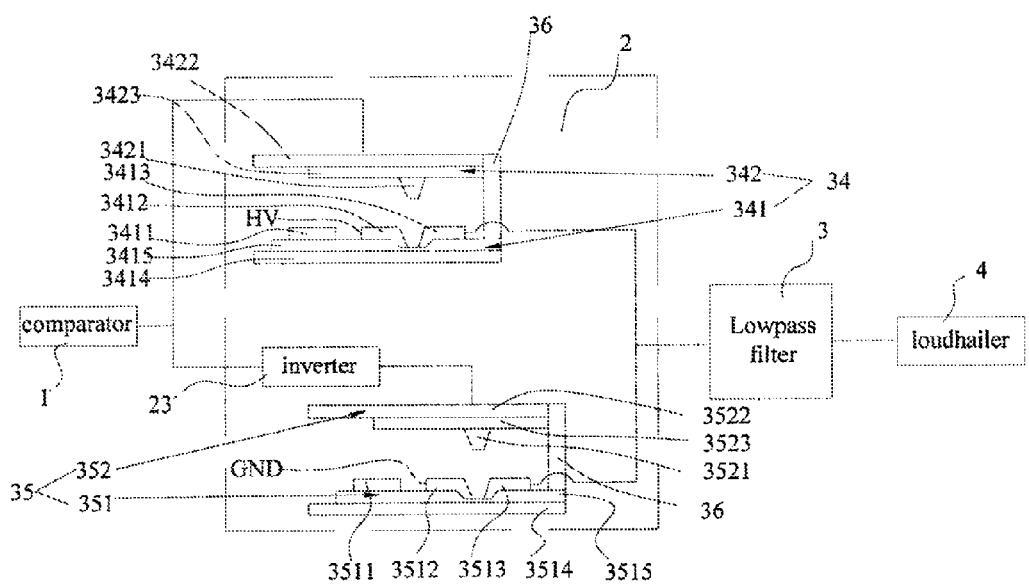
FIG. 4 shows the structure of the power amplifier according to the second embodiment of the present invention.

Referring to FIG. 4, it is structural sketch of the power amplifier according to the second embodiment of the present invention. In this embodiment, the power amplifier comprises: a comparator 1, a bridge circuit 2, and a low-pass filter 3. The difference between this embodiment and the first embodiment is as follows: the structure of a first MEMS switch 34 and a second MEMS switch 35 in this embodiment is different from the structure of the first MEMS switch 24 and the second MEMS switch 25 in the first embodiment. The first MEMS switch 34 comprises a first electrode 341 and a second electrode 342 which are arranged opposite to each other. The first electrode 341 comprises a first polar plate 3411 which receives a first control signal, a first conductor 3412 which connects to a high voltage HV, and a second conductor 3413 which connects to the input end of the low-pass filter 3. In this embodiment, the first electrode 341 further comprises a first basal plate 3414 and a first insulating layer 3415. The first basal plate 3414 is a semiconductor substrate such as silicon substrate, and the first insulating layer 3415 is a silicon dioxide layer. The first insulating layer 3415 is formed on the first basal plate 3414. The first polar plate 3411, the first conductor 3412 and the second conductor 3413 are formed on the first insulating layer 3415. In this embodiment, the second electrode 342 comprises a first connecting conductor 3421, a second polar plate 3422 and a second insulating layer 3423. The second polar plate 3422 connects to the output end of the comparator 1. The second polar plate 3422 and the first connecting conductor 3421 are formed on the opposite surface of the second insulating layer 3423.

Referring to FIG. 4, the second MEMS switch 35 in the second embodiment comprises a third electrode 351 and a fourth electrode 352 which are arranged opposite to each other. The third electrode 351 comprises a fourth polar plate 3511 which receives a second control signal, a third conductor 3512 which connects to the ground, and a fourth conductor 3513 which connects to the input end of the low-pass filter 3. In this embodiment, the third electrode 351 further comprises a second basal plate 3514 and a third insulating layer 3515. The second basal plate 3514 is a semiconductor substrate such as silicon substrate, and the third insulating layer 3515 is a silicon dioxide layer. The third insulating layer 3515 is formed on the second basal plate 3514. The fourth polar plate 3511, the third conductor 3512 and the fourth conductor 3513 are formed on the third insulating layer 3515. In this embodiment, the fourth electrode 352 comprises a second connecting conductor 3521, a third polar plate 3522 and a fourth insulating layer 3523. The third polar plate 3522 connects to the output end of the inverter 3. The third polar plate 3522 and the second connecting conductor 3521 are formed on the opposite surface of the fourth insulating layer 3523. In this embodiment, the first MEMS switch 34 and the second MEMS switch 35 both comprises a spring arm 36, and it makes that the fourth electrode 352 shifts away from or close to the third electrode 351, or the second electrode 342 shifts away from or close to the first electrode 341, possible.

Referring to FIG. 4, the working process of this embodiment and the first embodiment are similar to each other. It is illustrated briefly thereafter.

When the first MEMS switch 34 and the second MEMS switch 35 works, the polarity of the first control signal put on the first polar plate 3411 and the polarity of the second control signal put on the fourth polar plate 3511 are the same.

When the polarity of the output signal of the comparator 1 is opposite to the first polar plate 3411, the polarity of the first polar plate 3411 is also opposite to the second polar plate 3422. The static pull-in between the first polar plate 3411 and the second polar plate 3422 draws the first connecting conductor 3421 near to the first conductor 3412 and the second conductor 3413, in this way, the high voltage HV connected to the first connecting conductor 3421 can be transmitted into the input end of the low-pass filter 3. Moreover, because of the inverter 23, the polarity of the fourth polar plate 3511 and the third polar plate 3522 are the same, the fourth electrode 352 will not move to the third electrode 351, so the second connecting conductor 3521, the third conductor 3512 and the fourth conductor 3513 will not be activated, and the ground signal will not be transmitted to the input end of the low-pass filter 3.

Similarly, When the polarity of the output signal of the comparator 1 and the first polar plate 3411 are the same, the second electrode 342 of the first MEMS switch 34 will not move to the first electrode 341, then the high voltage HV will not be transmitted to the input end of the low-pass filter 3. The second electrode 352 of the second MEMS switch 35 will move to the first electrode 351 because of static pull-in, whereby the third conductor 3512 and the fourth conductor 3513 will be connected through the second connecting conductor 3521, and the ground signal GND will be transmitted to the input end of the low-pass filter 3. Again and again, the input end of the low-pass filter 3 receives a square wave signal whose amplitude value is HV because of the output signal of the comparator 1. In other words, the square wave signal output by the comparator 1 is amplified to a square wave signal whose amplitude value is HV after transmitting through the first MEMS switch 34 and the second MEMS switch 35. Next the amplified square wave signal is amplified and converted into an audio signal by the low-pass filter 3, and then transmitted to the loudhailer 4.

Likewise, some variations to this embodiment of the present invention are as follows. The first control signal is put on the first polar plate 3411, the output end of the comparator 1 is connected to the second polar plate 3422, the second control signal is put on the third polar plate 3522, and the output end of the inverter 23 is connected to the fourth polar plate 3511. Or, the first control signal is put on the second polar plate 3422, the output end of the comparator 1 is connected to the first polar plate 3411, the second control signal is put on fourth polar plate 3511, and the output end of the inverter 23 is connected to the third polar plate 3522. Or, the first control signal is put on the second polar plate 3422, the output end of the comparator 1 is connected to the first polar plate 3411, the second control signal is put on the third polar plate 3522, and the output end of the inverter 23 is connected to the fourth polar plate 3511. These variations have the same effect.

It is understandable that the first MEMS switch 34 and the second MEMS switch 35 used in a power amplifier can reduce the power consumption and the percentage area of the devices.

Figure 5:
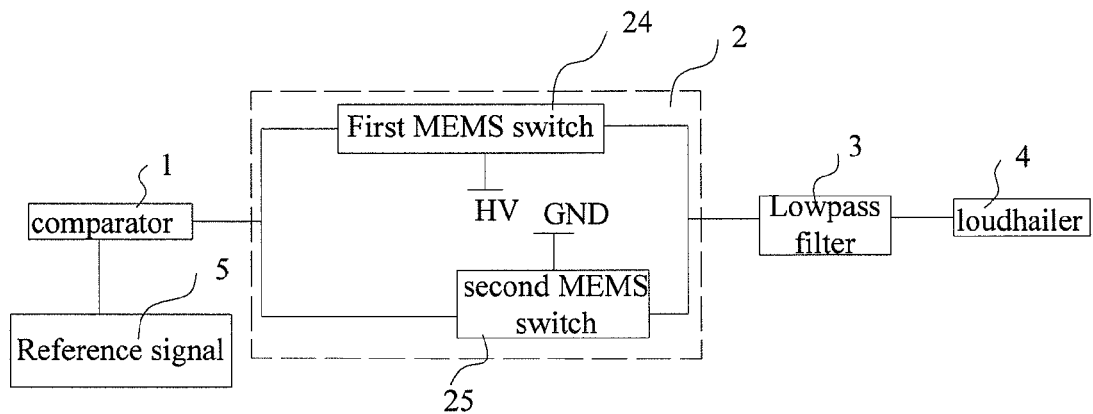
FIG. 5 shows another functional block diagram of the power amplifier of the present invention.

Referring to FIG. 5, the present invention is not necessarily comprising an inverter. The difference between the power amplifier in this solution and the power amplifier shown in FIG. 2 is that the bridge circuit has different structure. In this solution, the bridge circuit 2 comprises a first MEMS switch 24 and a second MEMS switch 25. The first MEMS switch 24 is under the control of a first control signal, connected to the output end of a comparator 1, a low-pass filter 3, and a high voltage HV. The second MEMS switch 25 is under the control of a second control signal, connected to the output end of a comparator 1, a low-pass filter 3, and a ground signal GNU. The first MEMS switch 24 and the second MEMS switch 25 switch on alternately when the polarity of the first control signal or the second control signal is opposite to the polarity of the output signal of the comparator 1, and output the high voltage HV or the ground signal GND accordingly to the low-pass filter 3. Then the low-pass filter 3 converts the HV or GND signal into an audio signal and transmits the audio signal to a loudhailer 4.

Figure 6:
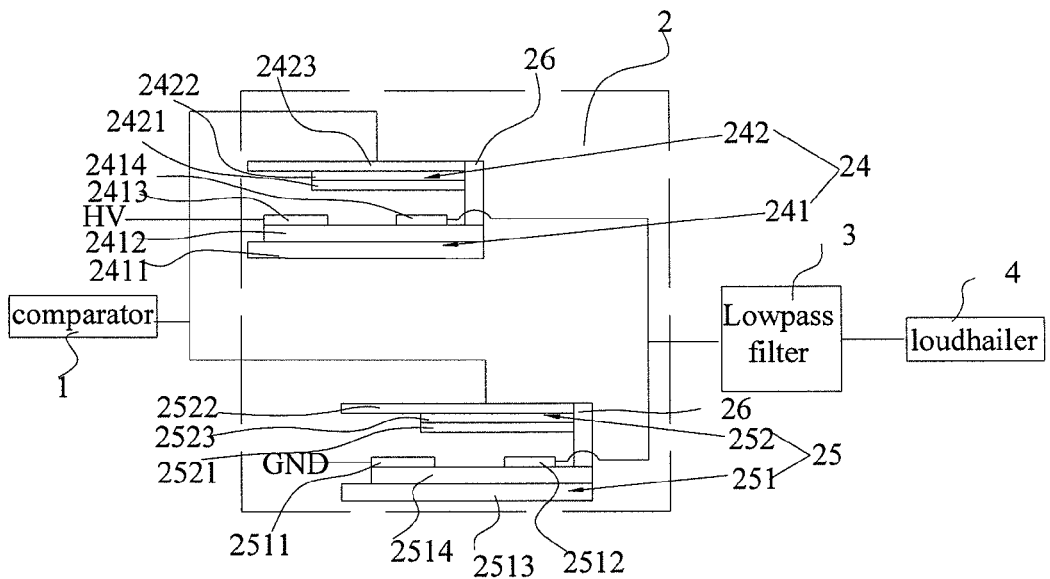
FIG. 6 shows the structure of the power amplifier according to the third embodiment of the present invention.

Referring to FIG. 6, how the invention adopts MEMS switches realizing power amplifying without an inverter is illustrated hereafter. The first MEMS switch 24 and the second MEMS switch 25 still adopt the structure shown in FIG. 3, but the opposite of the first control signal and the second control signal are opposite to each other. The first control signal is put on the first basal plate 2411 of the first MEMS switch 24. The second control signal is put on the second basal plate 2513 of the second MEMS switch 25. The working principle is the same as the power amplifier with an inverter.

Likewise, some variations to this embodiment of the present invention are as follows. The first control signal is put on the first basal plate 2411, the output end of the comparator 1 is connected to the second polar plate 2423, the second control signal is put on the third polar plate 2522, and the output end of the comparator 1 is connected to the second basal plate 2513. Or, the first control signal is put on the second polar plate 2423, the output end of the comparator 1 is connected to the first basal plate 2411, the second control signal is put on the second basal plate 2513, and the output end of the comparator 1 is connected to the third polar plate 2522. Or, the first control signal is put on the second polar plate 2423, the output end of the comparator 1 is connected to the first basal plate 2411, the second control signal is put on the third polar plate 2522, and the output end of the comparator 1 is connected to the second basal plate 2513. The working process is similar to the first embodiment.

Figure 7:
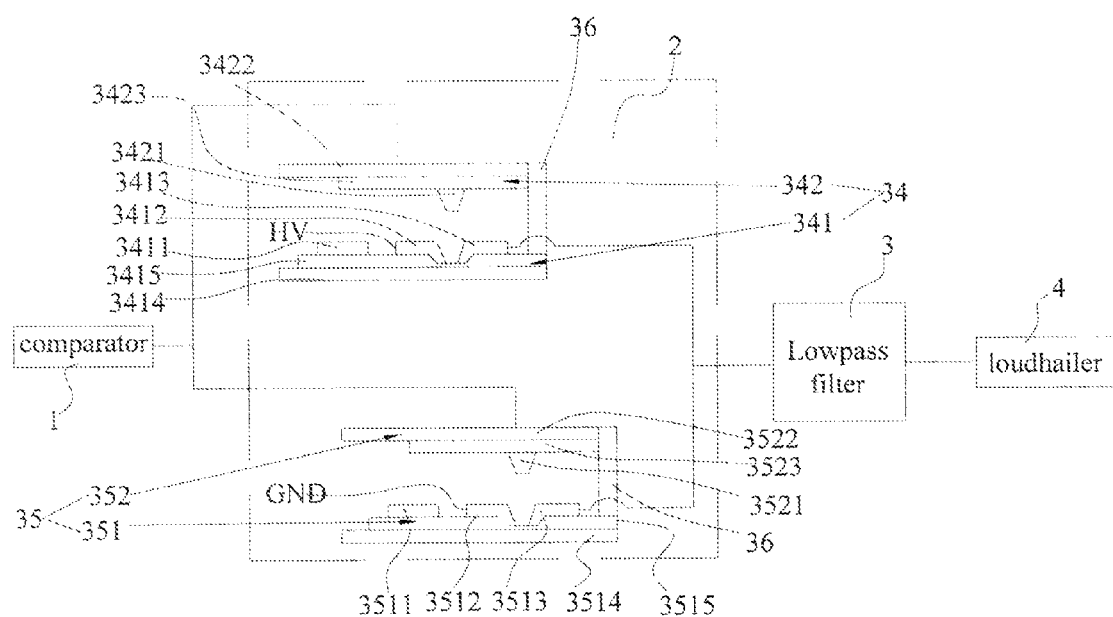
FIG. 7 shows the structure of the power amplifier according to the fourth embodiment of the present invention.

Referring to FIG. 7, how the invention adopts MEMS switches realizing power amplifying without an inverter is illustrated hereafter. The first MEMS switch 34 and the second MEMS switch 35 still adopt the structure shown in FIG. 4, but the polarity of the first control signal and the second control signal are opposite to each other. The first control signal is put on the first polar plate 3411 of the first MEMS switch 34. The second control signal is put on the fourth polar plate 3511 of the second MEMS switch 35. The working principle is the same as the power amplifier with an inverter.

Likewise, some variations to this embodiment of the present invention are as follows. The first control signal is put on the first polar plate 3411, the output end of the comparator 1 is connected to the second polar plate 3422, the second control signal is put on the third polar plate 3522, and the output end of the comparator 1 is connected to the fourth polar plate 3511. Or, the first control signal is put on the second polar plate 3422, the output end of the comparator 1 is connected to the first polar plate 3411, the second control signal is put on the fourth polar plate 3511, and the output end of the comparator 1 is connected to the third polar plate 3522. Or, the first control signal is put on the second polar plate 3422, the output end of the comparator 1 is connected to the first polar plate 3411, the second control signal is put on the third polar plate 3522, and the output end of the comparator 1 is connected to the fourth polar plate 3511. The working process is similar to the first embodiment.

In addition, the MEMS switch can be formed with other types of structures, such as three-electrode MEMS switches. In this three-electrode scheme, the middle electrode is a movable part, and the polarity of the up electrode is opposite to the down electrode. If different voltages are put on the middle electrode, the up and down electrode will generate an attractive force and a repelling force, and perform switching on-off function by this means. In a word, this kind of switch also can achieve the purpose that using MEMS switches realize power amplifying. The detailed working principle is the same as adopting the first MEMS switch 24 and the second MEMS switch 25. In the end, although the above descriptions take an audio signal as example, the present invention is also fit for other analog signals.

Although the present invention has been disclosed as above with reference to preferred embodiments thereof but will not be limited thereto. Those skilled in the art can modify and vary the embodiments without departing from the spirit and scope of the present invention. Accordingly, the scope of the present invention shall be defined in the appended claims.

What is claimed is:

1. A power amplifier comprising:
   a comparator for receiving a first analog signal, comparing the first analog signal with a reference signal and outputting a square wave signal;
   a bridge circuit for amplifying the square wave signal, outputting an amplified square wave signal, and comprising a first MEMS switch and a second MEMS switch, the first MEMS switch and the second MEMS switch turning on alternately when the polarity of the square wave changes, and outputting a first voltage signal or a second voltage signal respectively; and
   a low-pass filter for converting the amplified square wave signal into a second analog signal,
   wherein the first MEMS switch comprises:
   a first electrode including a first conductor and a second conductor connected to the input end of the low-pass filter;
   a second electrode including a first connecting conductor;
   the first electrode and the second electrode being configured to shift away from or close to each other under the control of the square wave signal, and connecting the first conductor and the second conductor through the first connecting conductor, thereby transmitting the first voltage signal put on the first conductor to the second conductor;
   and the second MEMS switch comprises:
   a third electrode, including a third conductor and a fourth conductor connected to the input end of the low-pass filter;
   a fourth electrode, including a second connecting conductor;
   the third electrode and the fourth electrode being configured to shift away from or close to each other under the control of the square wave signal, and connecting the third conductor and the fourth conductor through the second connecting conductor, thereby transmitting the second voltage signal put on the third conductor to the fourth conductor.

2. The power amplifier according to claim 1, wherein the first electrode further comprises a first basal plate and a first insulating layer set on the first basal plate, the first conductor and the second conductor being set on the surface of the first insulating layer;
   the second electrode further comprises a second polar plate and a second insulating layer, the first connecting conductor and the second polar plate being arranged on the opposite surface of the second insulating layer, the first basal plate and the second polar plate being configured to shift away from or close to each other according to the square wave signal;
   the third electrode further comprises a second basal plate and a third insulating layer set on the second basal plate, the third conductor and the fourth conductor being set on the surface of the third insulating layer; and
   the fourth electrode further comprises a third polar plate and a fourth insulating layer, the second connecting conductor and the third polar plate being arranged on the opposite surface of the fourth insulating layer, the second basal plate and the third polar plate being configured to shift away from or close to each other according to the square wave signal.

3. The power amplifier according to claim 2, wherein the output end of the comparator is connected to the second polar plate of the first MEMS switch and the third polar plate of the second MEMS switch, while the first basal plate and the second basal plate are of opposite polarity;
   or the output end of the comparator is connected to the second polar plate of the first MEMS switch and the second basal plate of the second MEMS switch, while the first basal plate and the third polar plate are of opposite polarity;
   or the output end of the comparator is connected to the first basal plate of the first MEMS switch and the third polar plate of the second MEMS switch, while the second polar plate and the second basal plate are of opposite polarity;
   or the output end of the comparator is connected to the first basal plate of the first MEMS switch and the second basal plate of the second MEMS switch, while the second polar plate and the third polar plate are of opposite polarity.

4. The power amplifier according to claim 2, wherein the output end of the comparator is connected to the second polar plate of the first MEMS switch and to the third polar plate of the second MEMS switch through an inverter, while the first basal plate and the second basal plate are of the same polarity;
   or the output end of the comparator is connected to the second polar plate of the first MEMS switch, and to the second basal plate of the second MEMS switch through an inverter, while the first basal plate and the third polar plate are of the same polarity;
   or the output end of the comparator is connected to the first basal plate of the first MEMS switch, and to the third polar plate of the second MEMS switch through an inverter, while the second polar plate and the second basal plate are of the same polarity;
   or the output end of the comparator is connected to the first basal plate of the first MEMS switch, and to the second basal plate of the second MEMS switch through an inverter, while the second polar plate and the third polar plate are of the same polarity.

5. The power amplifier according to claim 1, wherein the first electrode further comprises a first basal plate and a first insulating layer set on the first basal plate, while a first polar plate, the first conductor and the second conductor are on the surface of the first insulating layer;
   the second electrode further comprises a second polar plate and a second insulating layer, the first connecting conductor and the second polar plate being set on the opposite surface of the second insulating layer, the first polar plate and the second polar plate being configured to shift away from or close to each other according to the square wave signal;
   the third electrode further comprises a second basal plate and a third insulating layer set on the second basal plate, while a fourth polar plate, the third conductor and the fourth conductor are set on the surface of the third insulating layer; and
   the fourth electrode further comprises a third polar plate and a fourth insulating layer, the second connecting conductor and the third polar plate being set on the opposite surface of the fourth insulating layer, the fourth polar plate and the third polar plate being configured to shift away from or close to each other according to the square wave signal.

6. The power amplifier according to claim 5, wherein the output end of the comparator is connected to the second polar plate of the first MEMS switch and the third polar plate of the second MEMS switch, while the first polar plate and the fourth polar plate are of opposite polarity;
   or the output end of the comparator is connected to the first polar plate of the first MEMS switch and the fourth polar plate of the second MEMS switch, while the second polar plate and the third polar plate are of opposite polarity;

or the output end of the comparator is connected to the second polar plate of the first MEMS switch and the fourth polar plate of the second MEMS switch, while the first polar plate and the third polar plate are of opposite polarity;

or the output end of the comparator is connected to the first polar plate of the first MEMS switch and the third polar plate of the second MEMS switch, while the second polar plate and the fourth polar plate are of opposite polarity.

7. The power amplifier according to claim 5, wherein the output end of the comparator is connected to the first polar plate of the first MEMS switch, and to the fourth polar plate of the second MEMS switch through an inverter, while the second polar plate and the third polar plate are of the same polarity;

or the output end of the comparator is connected to the first polar plate of the first MEMS switch, and to the third polar plate of the second MEMS switch through an inverter, while the second polar plate and the fourth polar plate are of the same polarity;

or the output end of the comparator is connected to the second basal plate of the first MEMS switch, and to the fourth polar plate of the second MEMS switch through an inverter, while the first polar plate and the third polar plate are of the same polarity;

or the output end of the comparator is connected to the second polar plate of the first MEMS switch, and to the third polar plate of the second MEMS switch through an inverter, while the first polar plate and the fourth polar plate are of the same polarity.

8. A bridge circuit in a power amplifier, comprising:

a first MEMS switch for receiving a square wave signal and a first voltage signal;

a second MEMS switch for receiving a square wave signal and a second voltage signal, and the first MEMS switch and the second MEMS switch turning on alternately when the polarity of the square wave changes, and outputting a first voltage signal or a second voltage signal respectively; and an amplified square wave signal comprising the first voltage signal and the second voltage signal output alternately, wherein the first MEMS switch comprises:

a first electrode including a first conductor and a second conductor connected to the input end of the low-pass filter;

a second electrode including a first connecting conductor, the first electrode and the second electrode being configured to shift away from or close to each other under the control of the square wave signal, and connecting the first conductor and the second conductor through the first connecting conductor, thereby transmitting the first voltage signal put on the first conductor to the second conductor;

and the second MEMS switch comprises:

a third electrode including a third conductor and a fourth conductor connected to the input end of the low-pass filter;

a fourth electrode including a second connecting conductor, and the third electrode and the fourth electrode being configured to shift away from or close to each other under the control of the square wave signal, and connecting the third conductor and the fourth conductor through the second connecting conductor, thereby transmitting the second voltage signal put on the third conductor to the fourth conductor.

9. The bridge circuit in a power amplifier according to claim 8, wherein the first electrode further comprises a first basal plate and a first insulating layer set on the first basal plate, the first conductor and the second conductor being set on the surface of the first insulating layer;

the second electrode further comprises a second polar plate and a second insulating layer, the first connecting conductor and the second polar plate being arranged on the opposite surface of the second insulating layer, and the first basal plate and the second polar plate being configured to shift away from or close to each other according to the square wave signal, the third electrode further comprises a second basal plate and a third insulating layer set on the second basal plate, the third conductor and the fourth conductor being set on the surface of the third insulating layer; and the fourth electrode further comprises a third polar plate and a fourth insulating layer, the second connecting conductor and the third polar plate being arranged on the opposite surface of the fourth insulating layer, and the second basal plate and the third polar plate being configured to shift away from or close to each other according to the square wave signal.

10. The bridge circuit in a power amplifier according to claim 9, wherein the output end of the comparator is connected to the second polar plate of the first MEMS switch and the third polar plate of the second MEMS switch, while the first basal plate and the second basal plate are of opposite polarity;

or the output end of the comparator is connected to the second polar plate of the first MEMS switch and the second basal plate of the second MEMS switch, while the first basal plate and the third polar plate are of opposite polarity;

or the output end of the comparator is connected to the first basal plate of the first MEMS switch and the third polar plate of the second MEMS switch, while the second polar plate and the second basal plate are of opposite polarity;

or the output end of the comparator is connected to the first basal plate of the first MEMS switch and the second basal plate of the second MEMS switch, while the second polar plate and the third polar plate are of opposite polarity.

11. The bridge circuit in a power amplifier according to claim 9, wherein the output end of the comparator is connected to the second polar plate of the first MEMS switch, and to the third polar plate of the second MEMS switch through an inverter, while the first basal plate and the second basal plate are of the same polarity;

or the output end of the comparator is connected to the second polar plate of the first MEMS switch, and to the second basal plate of the second MEMS switch through an inverter, while the first basal plate and the third polar plate are of the same polarity;

or the output end of the comparator is connected to the first basal plate of the first MEMS switch, and to the third polar plate of the second MEMS switch through an inverter, while the second polar plate and the second basal plate are of the same polarity;

or the output end of the comparator is connected to the first basal plate of the first MEMS switch, and to the second basal plate of the second MEMS switch through an inverter, while the second polar plate and the third polar plate are of the same polarity.

12. The bridge circuit in a power amplifier according to claim 8, wherein the first electrode further comprises a first basal plate and a first insulating layer set on the first basal plate, while a first polar plate, the first conductor and the second conductor are on the surface of the first insulating layer;

the second electrode further comprises a second polar plate and a second insulating layer, the first connecting conductor and the second polar plate being set on the opposite surface of the second insulating layer, the first polar plate and the second polar plate being configured to shift away from or close to each other according to the square wave signal;

the third electrode further comprises a second basal plate and a third insulating layer set on the second basal plate, while a fourth polar plate, the third conductor and the fourth conductor are set on the surface of the third insulating layer; and the fourth electrode further comprises a third polar plate and a fourth insulating layer, the second connecting conductor and the third polar plate being set on the opposite surface of the fourth insulating layer, the fourth polar plate and the third polar plate being configured to shift away from or close to each other according to the square wave signal.

13. The bridge circuit in a power amplifier according to claim 12, wherein the output end of the comparator is connected to the second polar plate of the first MEMS switch and the third polar plate of the second MEMS switch, while the first polar plate and the fourth polar plate are of opposite polarity;

or the output end of the comparator is connected to the first polar plate of the first MEMS switch and the fourth polar plate of the second MEMS switch, while the second polar plate and the third polar plate are of opposite polarity;

or the output end of the comparator is connected to the second polar plate of the first MEMS switch and the fourth polar plate of the second MEMS switch, while the first polar plate and the third polar plate are of opposite polarity;

or the output end of the comparator is connected to the first polar plate of the first MEMS switch and the third polar plate of the second MEMS switch, while the second polar plate and the fourth polar plate are of opposite polarity.

14. The bridge circuit in a power amplifier according to claim 12, wherein the output end of the comparator is connected to the first polar plate of the first MEMS switch, and to the fourth polar plate of the second MEMS switch through an inverter, while the second polar plate and the third polar plate are of the same polarity;

or the output end of the comparator is connected to the first polar plate of the first MEMS switch, and to the third polar plate of the second MEMS switch through an inverter, while the second polar plate and the fourth polar plate are of the same polarity;

or the output end of the comparator is connected to the second basal plate of the first MEMS switch, and to the fourth polar plate of the second MEMS switch through an inverter, while the first polar plate and the third polar plate are of the same polarity;

or the output end of the comparator is connected to the second polar plate of the first MEMS switch, and to the third polar plate of the second MEMS switch through an inverter, while the first polar plate and the fourth polar plate are of the same polarity.

* * * * *